US 6,654,462 B1

(12) United States Patent  
Hedberg

(10) Patent No.: US 6,654,462 B1
(45) Date of Patent: Nov. 25, 2003

(54) LINE TERMINAL CIRCUIT FOR CONTROLLING THE COMMON MODE VOLTAGE LEVEL ON A TRANSMISSION LINE

(75) Inventor: Mats Hedberg, Haninge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/331,634

(22) PCT Filed: Dec. 22, 1997

(86) PCT No.: PCT/EP97/07229

§ 371 (c)(1),
(2), (4) Date: Oct. 4, 1999

(87) PCT Pub. No.: WO98/28886

PCT Pub. Date: Jul. 2, 1998

(30) Foreign Application Priority Data

Dec. 23, 1996 (DE) .......................... 196 54 221

(51) Int. Cl.⁷ .................. H04M 1/00; H04M 9/00; H04M 9/08
(52) U.S. Cl. .................. 379/399.01; 379/401; 379/404; 379/413
(58) Field of Search ................ 379/399.01–413.02

(56) References Cited

U.S. PATENT DOCUMENTS

| 4,560,921 A | 12/1985 | Yamatake |
| 5,347,577 A | * 9/1994 | Takato et al. |
| 5,511,118 A | * 4/1996 | Gores et al. |

FOREIGN PATENT DOCUMENTS

| EP | 0641069 | 3/1995 |
| WO | WO 94/01936 | 1/1994 |
| WO | WO 9502926 | 1/1995 |
| WO | WO 95/15616 | 6/1995 |
| WO | WO 95/18487 | 7/1995 |
| WO | WO 95/22853 | 8/1995 |
| WO | WO 95/24089 | 9/1995 |
| WO | WO 95/26076 | 9/1995 |
| WO | WO 95/26078 | 9/1995 |
| WO | WO 9526128 | 10/1995 |
| WO | WO 96/16494 | 5/1996 |

\* cited by examiner

*Primary Examiner*—Duc Nguyen

(57) ABSTRACT

A line terminal circuit comprises a buffer section (A, D) for connection to a transmission line (TL) and for performing at least one of the functions receiving signals from said transmission line and transmitting signals via said transmission line; a controllable current source section (S1, S2) connected to inject or withdraw a current (Iu, Id) into or from a node (ND1, ND2) between said buffer section and said transmission line in accordance with a current control signal (CS); and a common mode voltage control section (CT) for detecting a common mode voltage component on the transmission line (TL) connected to the buffer section (A, D) and for generating said current control signal (CS) in response to said detected common mode voltage component and outputting said current control signal to said current source section (S1, S2); said common mode voltage control section (CT) being adapted to output said current control signal (CS) such that said common mode voltage component is within the limits of a predetermined voltage interval (Vrefh, Vrefl).

19 Claims, 3 Drawing Sheets

LINE TERMINAL CIRCUIT FOR CONTROLLING THE COMMON MODE VOLTAGE LEVEL ON A TRANSMISSION LINE

The present invention relates to a line terminal circuit according to the preamble of claim 1. A circuit of this kind is known from WO-A-95 26128.

For the transmission of digital signals between different circuit sections of a digital system, line terminal circuits are used as interfaces between a transmission line and digital circuits providing data for transmission or receiving transmitted data. A line terminal circuit usually comprises some kind of buffer section which acts as a line driver or as a line receiver, depending on whether the line terminal circuit is designed for operating at the transmitting end of the transmission line or at its receiving end.

In larger systems it can happen that for whatever reason, different system sections employ different logic standards with different signalling voltage levels. Well known examples of such logic standards are TTL, ECL, DPECL, LVDS and so on. Also, reference voltage offsets, e.g. ground voltage offsets, and the like can occur between different sections of the system. If a symmetric transmission line (e.g. twisted pair) is used, in some cases there may be no fixed common reference at all between the transmitting side and the receiving side (this latter situation is called "floating").

If an asymmetric transmission line is used, a reference voltage offset between the transmitter side and the receiver side will appear as a DC bias voltage superimposed on the signalling voltage. If a symmetrical transmission line is used, such offset will appear, e.g. at the receiver end as a common mode voltage on both conductors of the transmission line with respect to the ground potential of the receiver. For the sake of brevity, in the following only the term "common mode voltage" will be used for both cases of an asymmetric and a symmetric transmission line.

In order to cope with situations of this kind it can be advantageous to design the line terminal circuit at the transmitting and/or receiving end such that a certain common mode voltage present on the transmission line is tolerated. Examples of such designs on the receiving side include the use of well known operational amplifiers with a sufficiently large input common mode voltage range. Examples of such designs in the transmitting line terminal circuit include supplying the driver with power by means of connecting it between a series connection of constant current sources, such that the supply voltage of the driver circuit, and hence the common mode voltage output by the driver, may float up and down without affecting the operation of the driver circuit. Another example is a driver that drives the transmission line with signalling currents rather than with signalling voltages.

Of course, there will be limits for the range, within which such a line terminal circuit will be able to work. If the common mode voltage exceeds the upper or lower limit of this range, proper signal transmission or reception can no longer be performed by the respective line terminal circuit and the circuit may even be damaged.

It is the object of the present invention, to provide a line terminal circuit which can properly operate over a significantly extended common mode voltage range and which can be integrated on a semiconductor chip without requiring much space on the chip surface.

According to the present invention this object is solved as defined in claim 1.

Advantageous embodiments are given in the dependent claims.

According to the present invention, currents are injected or withdrawn into or from the transmission line in order to raise or lower the common mode voltage component to such an extent that the resulting common mode voltage falls within an operating window of the transmitter line terminal circuit and receiver line terminal circuit, respectively. Due to the action of the current control section, the current injected or withdrawn is adjusted such that its magnitude can counteract the cause for an excessive common mode voltage at the transmitter or receiver end of the transmission line.

Preferably, resistances with preferably equal values are connected in series with the conductors of the transmission line, such that a current injected by the controllable current source results in respective voltage drops across these resistors. The voltage drops can then counteract the cause for the undesired common mode voltage. The resistances are preferably located such that they do not adversely affect the proper termination of the transmission line. As an example, these resistances can be located at the receiving end between the line termination network and the input terminals of the buffer section, the current source for the respective conductor of the transmission line then being connected to the node between the respective input terminal of the buffer and the respective resistance.

A system for transmitting digital data via a transmission line preferably comprises a respective line terminal circuit in accordance with the invention both at the transmitting end and at the receiving end of the line. In this case the line terminal circuit at one end can take up or provide the current injected or withdrawn by the line terminal circuit at the other end while independently maintaining the common mode voltage at both ends within proper limits.

A predetermined fixed common mode voltage can be achieved if the limits of the common mode range set in the control section, are made substantially coincident. In this case the control section will control the common mode voltage to approximate or equal a predefined common mode voltage target value.

In the following, preferred embodiments not limiting the scope of the invention will be explained with reference to the accompanying drawings.

Figure 1:
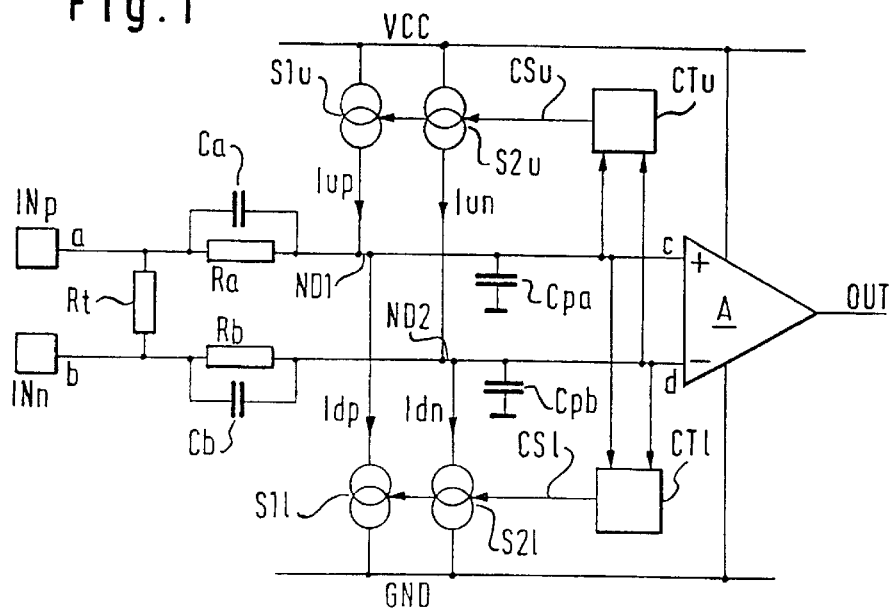
FIG. 1 shows a block diagram of a first embodiment of a line terminal circuit according to the present invention.

FIG. 1 shows a block diagram of a first embodiment of a line terminal circuit according to the present invention. In this figure, A denotes a buffer circuit having a noninverting input (+) and an inverting input (−), and furthermore having an output OUT. The positive input (+) of the buffer circuit A is connected to a first input terminal INp via a resistor Ra and the inverting input of the buffer A is connected with a second input terminal INn via a resistor Rb. Capacitances Ca and Cb, respectively, are provided in parallel with resistor Ra and Rb, respectively, in order to compensate for the influence of the parasitic capacitances Cpa and Cpb, respectively, on the frequency response of the input circuit. Rt denotes a termination resistor connected across the first and second input terminals INp and INn in order to provide for proper termination of a transmission line connected to the input terminals.

Reference characters S1u and S1l denote controllable current sources together constituting a first controllable current source section S1 connected to inject or withdraw a current into or from a node ND1 between the noninverting input (+) of the buffer section A and the resistor Ra. Similarly, reference characters S2u and S2l denote controllable current sources constituting a second controllable current source section S2 for injecting or withdrawing a current into or from a node ND2 between the inverting input of the buffer section A and resistor Rb. In this embodiment, the current source S1u is connected between an upper power supply potential VCC and the noninverting input (+) of the buffer A while the current source S1l is connected between the noninverting input (+) of the buffer A and a lower power supply potential GND. Current source S2u is connected between the upper power supply potential VCC and the inverting input (−) of the buffer A while current source S2l is connected between the inverting input (−) of the buffer A and the lower power supply potential GND. Of course, these current sources can alternatively be connected to other supply potentials in the circuit.

The two upper current sources S1u and S2u receive a first control signal CSu for controlling the amount of current Iup generated by current source S1u and the amount of current Iun generated by current source S2u. Similarly, the lower current sources S1l and S2l receive a control signal CSl for determining the amount of current Idp generated by current source S1l, and the amount of current Idn generated by current source S2l.

CTu and CTl, respectively, denotes an upper control section and lower control section, respectively, for outputting the upper control signal CSu to the upper current sources S1u and S2u, and the lower control signal CSl to the lower current sources S1l and S2l, respectively. Each control section CTu and CTl is connected to detect the common mode voltage at the noninverting input and the inverting input of buffer A. In operation, the upper control circuit CTu compares the detected common mode voltage at the input of buffer A with a lower limit value Vrefl and outputs the control signal CSu such that the common mode voltage at the input of buffer A does not fall below this lower limit. Similarly, the lower control circuit CTl detects the common mode voltage at the input of buffer A and outputs the control signal CSl to the lower current sources S1l and S2l such that the common mode voltage at the input of buffer A does not exceed an upper limit value Vrefh. If the common mode voltage approaches the upper or the lower limit value, the corresponding control circuit CTu will control the associated current sources S1u, S2u or S1l, S2l such that a current is injected into the transmission line in order to raise the common mode voltage (current Iup and Iun), or such that a current is withdrawn from the transmission line in order to lower the common mode voltage at the input of buffer A (current Idp and Idn).

If a symmetrical transmission line and differential signalling on the transmission line is used, the current Iup generated by the current source S1u preferably equals the current Iun generated by the current source S2u, and the current Idp generated by S1l preferably equals the current Idn generated by current source S2l. Also, in this case Ra preferably equals Rb, if Ra and Rb are provided.

Figure 2:
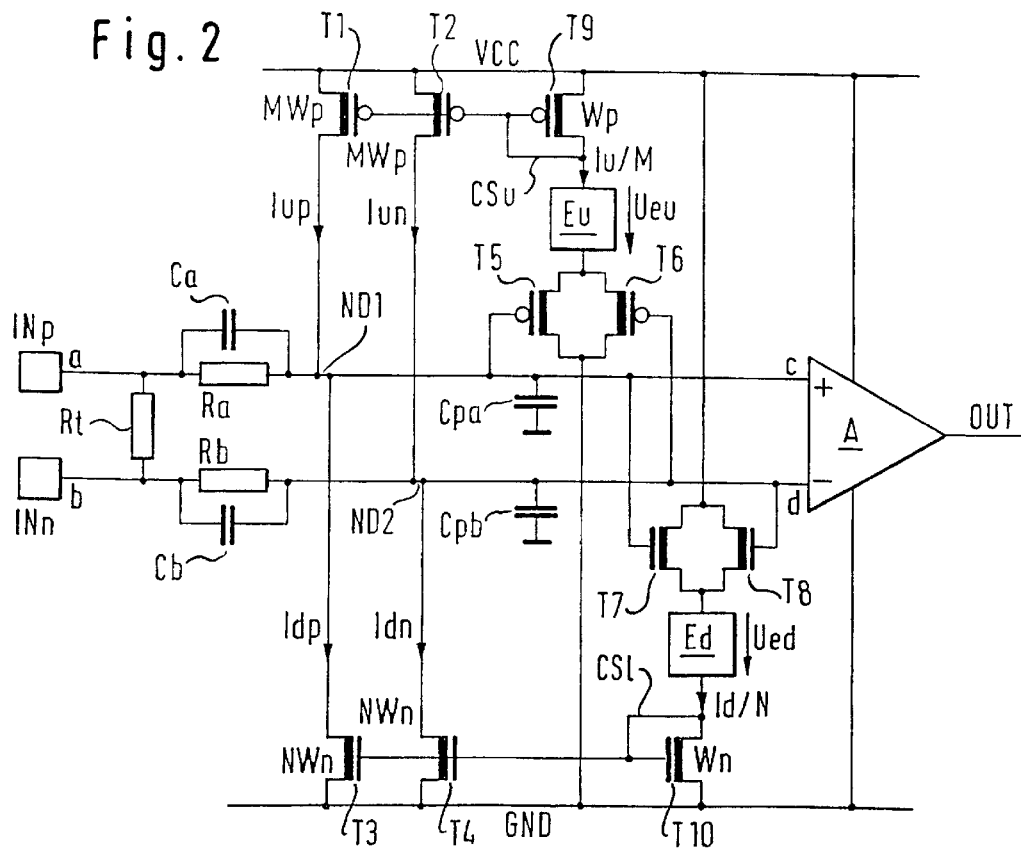
FIG. 2 shows a diagram of a circuit of the first embodiment according to FIG. 1.

FIG. 2 shows a specific implementation not limiting the scope of the invention, of the functional blocks shown in FIG. 1. Components which are similar to corresponding components in FIG. 1, bear the same reference characters. Regarding the connection, function and operation of these components, reference is made to the description given with respect to FIG. 1.

In FIG. 2, reference numeral T1 denotes a PMOS transistor which implements the function of the current source S1u. T2 denotes a PMOS transistor which implements the function of current source S2u. Similarly, reference characters T3 and T4 denote NMOS transistors for implementing the current source S1l and the current source S2l, respectively. Both transistors T1 and T2 receive at their gates the control signal CSu while both transistors T3 and T4 receive at their gates the control signal CSl.

Eu denotes a voltage source for generating a voltage Ueu. T5 and T6 denote PMOS transistors having their drain source paths connected in parallel. T9 denotes a PMOS transistor having its gate connected to its drain. The drain source path of transistor T9, the voltage source Eu and the parallel connection of transistors T5 and T6 are connected in series between the upper power supply potential VCC and the lower power supply potential GND. The elements T5, T6, T9 and Eu constitute an implementation of the upper control circuit CTu of FIG. 1. The gate of transistor T5 is connected with the noninverting input of buffer amplifier A while the gate of transistor T6 is connected with the inverting input of buffer circuit A. The drain potential of transistor T9 is output to the gates of transistors T1 and T2 as the control signal CSu.

T7 and T8 denote NMOS transistors having their drain source paths connected in parallel. The gate of T7 is connected with the noninverting input of the buffer circuit A while the gate of T8 is connected with the inverting input of the buffer circuit A. Ed denotes a voltage source for generating a voltage Ued.

T10 denotes an NMOS transistor having its drain and source connected together. As shown in FIG. 2, transistor T10, voltage source Ed and the parallel connection of transistors T7 and T8 is connected in series between the upper supply potential VCC and the lower supply potential GND. The drain potential of transistor T10 is output to the gates of transistors T3 and T4 as the control signal CSl. The elements T7, T8, T10 and Ed constitute an implementation of the lower control circuit CTl.

In FIG. 2, Wp indicates the channel width of transistor T9 and Wn indicates the channel width of transistor T10. With respect to transistors T3 and T4, NWn indicates that the channel width of these transistors is N times the channel width of transistor T10. With respect to transistors T1 and T2, MWp indicates that the channel width of these transistors is M times the channel width Wp of transistor T9.

In operation, transistor T9 constitutes a current mirror with transistor T2 and furthermore constitutes a current mirror with transistor T1. Depending on the channel width of each of these transistors, the current Iup flowing through transistor T1 will be M times as large as the current Iu/M through transistor T9. A corresponding relation holds for transistor T2.

The current Iu/M through transistor T9 in turn depends on the common mode voltage at the input of buffer amplifier A. Specifically, the current through the parallel connection of transistors T5 and T6 depends on the difference between the common mode voltage at the gates of T5 and T6 and the source potential of T5 and T6. The sources of T5 and T6 are in turn connected to the voltage source Eu such that the parallel connection of T5 and T6 will start conducting as soon as the common mode voltage, more specifically the lower of both gate voltages of T5 and T6, at the input of buffer A falls below VCC minus the sum of Ueu and the threshold voltages of T9 and T5 or T6. Due to the current mirror relation between T9 and T2 and between T9 and T1, currents Iup and Iun of equal amounts will then be injected into the respective conductors of the transmission line in order to raise the common mode voltage at the input of buffer A, without affecting the differential signalling voltage level across the noninverting input and the inverting input of the buffer A.

It is apparent that the voltage Ueu generated by the voltage source Eu can be used to adjust the lower limit of the common mode voltage range at the input of the buffer A.

The operating principle of the lower control CTl circuit including the elements T7, T8, T10 and Ed is similar to the operating principle of the upper control circuit CTu just described. Transistor T10 constitutes a current mirror with each of the transistors T4 and T3, and due to the channel width relation between the transistors constituting a current mirror, the current Idp and Idn withdrawn from the transmission line by transistors T3 and T4, will be N times the current Id/N flowing through transistor T10. The parallel connection of transistors T7 and T8 will turn conducting as soon as the common mode voltage, more specifically the higher of both gate voltages of T7 and T8, at the input of buffer A is higher than the sum of the threshold voltage of transistor T10, the voltage Ued generated by the voltage source Ed and the threshold voltage of transistor T7 or T8. From this it is apparent that the upper limit of the common mode voltage range can be adjusted by means of adjusting the voltage Ued.

The voltage sources Eu and Ed can be implemented in a large number of different ways. In a very simple case, the voltage sources Eu and Ed are omitted and replaced by a piece of wire. This will result in a comparatively large common mode voltage range without the option to adjust the limits of the same.

According to another implementation of the voltage source Eu and Ed, diodes or series connection of a plurality of diodes are used for generating constant voltages Ueu and Ued. It is also feasible to implement the voltage sources Eu and Ed by means of resistors, such that Ueu and Ued, respectively, depends on the current flowing through the respective resistors. This will result in a softer common mode voltage limitation as in the case that Eu and Ed are constant voltage sources. Of course, combinations of these implementations are equally possible according to need.

The implementation described with reference to FIG. 2 is advantageous in that it is simple and uses a small number of parts. Of course, other wellknown circuits for implementing the controllable current sources can be used, e.g. cascodes.

Figure 3:
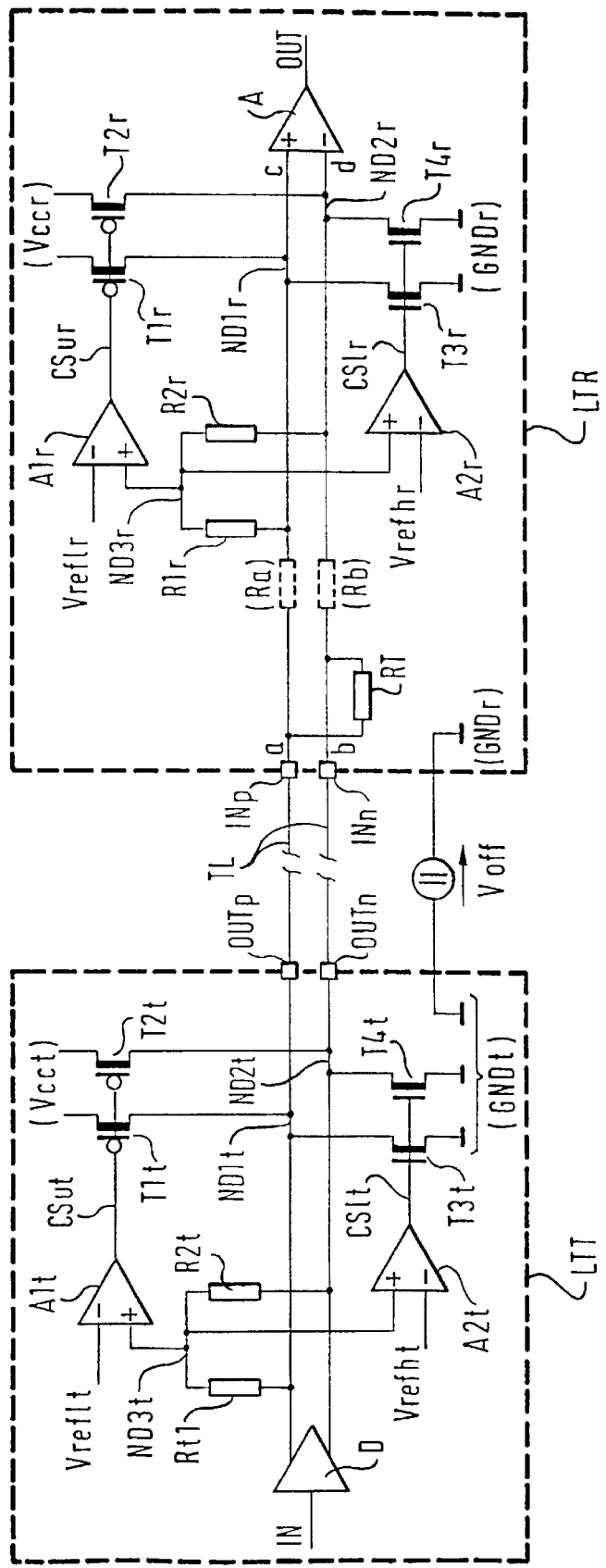
FIG. 3 shows a second and a third embodiment of a line terminal circuit according to the invention, and also shows an embodiment of a system for transmitting data via a transmission line according to the present invention.

FIG. 3 shows an embodiment of a system for transmitting data via a transmission line according to the present invention. The system shown in FIG. 3 comprises a line terminal circuit LTR at the receiving end of a transmission line TL and furthermore includes a line terminal circuit LTT at the transmitting end of the transmission line TL.

Independent from the system shown in FIG. 3, the line terminal circuit LTR of FIG. 3 constitutes a second embodiment of a line terminal circuit according to the present invention which will be described in the following.

The line terminal circuit LTR according to the second embodiment as shown in FIG. 3, comprises a buffer circuit A having a noninverting input and an inverting input respectively connected with a noninverting input terminal Inp and with an inverting input terminal INn, respectively. A termination impedance RT is provided across the input terminals INp and INn in order to provide for proper termination of the transmission line. The series resistors Ra and Rb between the noninverting input terminal INp and the noninverting input of buffer circuit A, and between the inverting input terminal INn and the inverting input of the buffer circuit A, respectively, are optional and are, therefore, depicted with dashed lines.

The line terminal circuit LTR according to the second embodiment furthermore includes transistors T1r to T4r the function and connection of which fully corresponds to transistors T1 to T4 of FIG. 2. A detailed description of these transistors can therefore be omitted here. In order to distinguish between components in a line terminal circuit at the transmitting side and similar components in a line terminal circuit at the receiving side, t and r, respectively, has been added to the respective reference signs in FIG. 3.

The second embodiment of a line terminal circuit furthermore includes a first operational amplifier A1r the output of which is connected with the gates of transistors T1r and T2r for providing a current control signal CSu to the gates of these transistors. The inverting input of the operational amplifier A1r receives a reference voltage Vreflr which may be generated in a variety of different known ways, e.g. by means of a resistive voltage divider network.

The line terminal circuit of this embodiment furthermore includes a second operational amplifier A2r the output of which is connected with the gates of transistors T3r and T4r in order to provide a lower current control signal CSl to the gates of these transistors. The inverting input of operational amplifier A2r is connected to receive a reference voltage Vrefhr which can be generated in a number of different known ways, e.g. by means of a resistive voltage divider network.

A series connection of resistors R1r and R2r is connected across nodes ND1r and ND2r at the inputs of the buffer circuit A. A node ND3r between these resistors R1r and R2r is connected with the noninverting input of the operational amplifier A1r and with the noninverting input of the operational amplifier A2r. In the alternative, maximum-minimum voltage detection can also be embodied by a pair of source followers having their gates connected similar to transistors T5 to T8 in FIG. 2. In this case, each of the operational amplifiers will receive a detection voltage at its noninverting input from its associated source follower.

The second embodiment of a line terminal circuit LTR as shown in FIG. 3, operates as follows. The series connection of resistors R1r and R2r provides at the node ND3 between these resistors a voltage corresponding to the common mode voltage at the inputs of buffer circuit A. This detected common mode voltage is received by the operational amplifiers A1r and A2r, and each of these amplifiers compares the detected common mode voltage with the associated reference voltage Vreflr or Vrefhr at the inverting input of the operational amplifier. If the detected common mode voltage is higher than Vrefhr applied to operational amplifier A2r, this operational amplifier will output a current control signal CSl with high potential, this resulting in the activation of the current sources T3r and T4r to withdraw currents with equal directions from both conductors of the transmission line in order to lower the common mode voltage at the inputs of buffer circuit A. Conversely, if the detected common mode voltage is below the reference voltage Vreflr applied to the inverting input of the first operational amplifier A1r, this operational amplifier will output a current control signal CSu with low potential and thus activate the current sources T1r and T2r to inject currents of equal directions into the two conductors of the transmission line, in order to raise the common mode voltage at the inputs of buffer A. In both cases, the currents supplied by the upper current sources T1r, T2r or by the lower current sources T3r, T4r, will be controlled by the respective operational amplifiers A1r and A2r such that the injected amount of current is just sufficient to keep the common mode voltage at the inputs of buffer A very close to Vreflr and Vrefhr, respectively, due to the high amplification of the operational amplifiers A1r and A2r. If the detected common mode voltage is below Vrefhr but above Vreflr, all current sources T1r to T4r will be turned off and no modification of the common mode voltage takes place.

This embodiment of a line terminal circuit is advantageous in that a common mode voltage control or limitation can be performed with good precision, due to the high amplification of the operational amplifiers A1r and A2r. Depending on the selection of the reference voltage values for Vreflr and Vrefhr, the circuit will either limit the common mode voltage at the inputs of the buffer circuit A to be within a predefined voltage range, or the circuit will control the common mode voltage to be close to a predetermined common mode voltage target value. This latter function is obtained if Vreflr and Vrefhr are set to have equal values.

FIG. 3 furthermore shows an embodiment of a line terminal circuit LTT located at the transmitting side of the transmission line TL. This circuit is identical in its structure to the second embodiment of a line terminal circuit LTR described above, except that the input buffer A is replaced by an output buffer D for driving the line.

If the common mode voltage at the output of buffer circuit D exceeds reference voltage Vrefht or falls below Vreflt, the same happens as in the case of the line terminal circuit at the receiver side. Operational amplifier A1t or A2t will output a current control signal CSut and CSlt, respectively such that due to the currents injected into or withdrawn from the transmission line TL, the common mode voltage will not reach outside the range limited by Vreflt and Vrefht.

In the following, an embodiment of a data transmission system will be described with reference to FIG. 3. This data transmission system comprises a line terminal circuit LTT in accordance with the present invention at the transmitting end of the transmission line, and furthermore comprises a line terminal circuit LTR according to the present invention at the receiving side of the transmission line.

In the following, the case will be considered that an offset voltage occurs between the ground potential GNDt at the transmitter side and the ground potential GNDr at the receiver side, for whatever reason. This ground potential difference is depicted in FIG. 3 as a voltage source Voff. of course, this voltage source is not a constituent element of this embodiment, but merely is a model for such an offset of the ground potentials.

The operation of the system depicted in FIG. 3 will be explained with reference to FIGS. 4a to 4c.

Figure 4A:
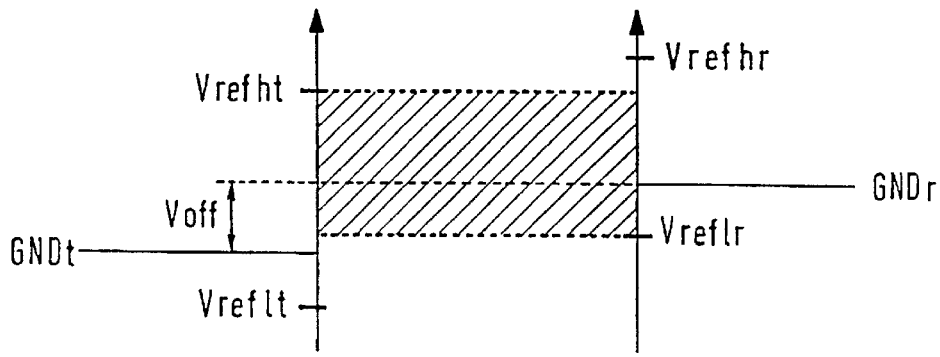
FIGS. 4a to 4c are diagrams for explaining the operation of the system of FIG. 3.
Figure 4B:
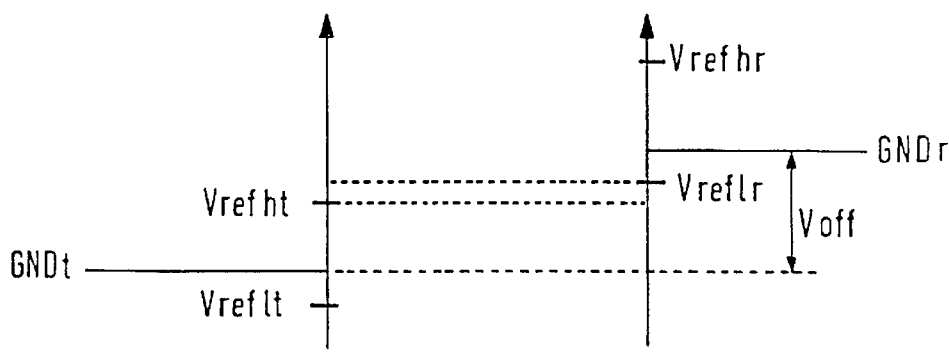
Figure 4C:
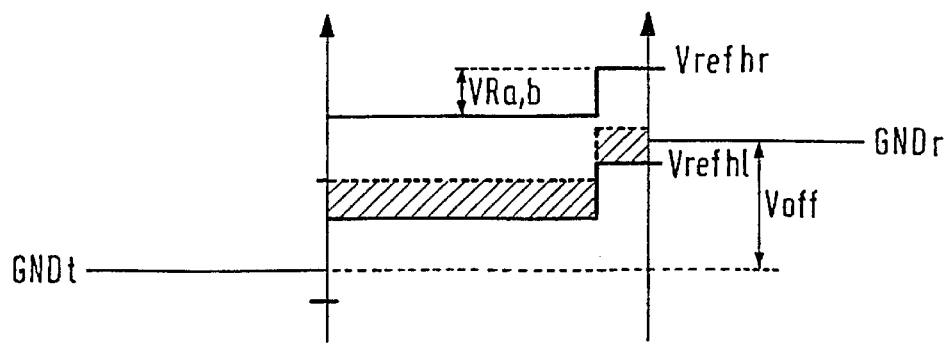

Each of the FIGS. 4a to 4c shows diagrams for comparing the common mode voltage range at the transmitting side with the common mode voltage range at the receiving side, taking into account the influence of a ground offset Voff. FIG. 4a shows the case that GNDr is by Voff higher than GNDt. In spite of this ground offset Voff, none of the common mode voltage limits at the transmitting side or at the receiving side is exceeded if the common mode voltage on the transmission line TL is between Vreflr and Vrefht. Accordingly, appropriate ones of the current sources in the line terminal circuit at the transmission side and in the line terminal circuit at the receiving side will become active only if the common mode voltage on the transmission line TL leaves the hatched area in FIG. 4a.

FIG. 4b refers to an example that the offset Voff is so large that every value for the common mode voltage on the transmission line TL is either outside the limits of the common mode voltage range of the transmit buffer D or is outside the common mode voltage range of the receive buffer A. In order to handle this situation, it is advantageous to provide resistors Ra and Rb in the course of the transmission line, preferably at such a location that the signal transmission and the proper line termination is not adversely effected. A preferable location of resistors Ra and Rb is between the line termination network, i.e. resistor Rt in the case of FIG. 3, and a node ND1, ND2 connected with the inputs of buffer circuit A where the respective current sources S1, S2 are connected.

The provision of resistors Ra and Rb results in a common mode voltage offset being generated across these resistors, if current is fed into the line by any of the current sources of the line terminal circuits. This common mode voltage offset Vab is depicted in FIG. 4c by means of a step in the lines referencing the common mode voltage limits Vrefhr and Vrefhl of the receiving side to the reference potential GNDt of the transmitting side. The height of the step is the voltage drop across the resistors Ra and Rb.

From this figure it is evident that inserting the optional resistors Ra and Rb enables increasing the allowable offset Voff between the transmitting side and the receiving side.

The maximum height of Vab in FIG. 4c depends on the resistance of Ra and Rb, respectively and furthermore on the current driving capabilities of the respective current sources.

It is to be noted that the data transmission system an example of which is depicted in FIG. 3, having a line terminal circuit according to the present invention both at the transmitting side and at the receiving side, does not limit the scope of the present invention to this particular case, but provides an example for the case that both at the transmitting side and at the receiving side certain common mode voltage limits must be kept. The line terminal circuit according to the present invention can be used equally well in data transmission systems at just one end of the transmission line, i.e. either at the transmitting end or at the receiving end. The line terminal circuit according to the present invention is suitable to keep the common mode voltage limits independently on the transmitter side and on the receiving side of the transmission line in spite of a large offset range between the reference potentials at the transmitting side and the receiving side.

A line terminal circuit according to the present invention can also be advantageously used for stabilizing the operating conditions on a transmission line against a large variety of electrical and electromagnetic external disturbances.

In the embodiments discussed above, PMOS transistors T1 and T2 are used as an implementation of the controllable current sources without limiting the invention thereto. For these embodiments, it may be advantageous for each PMOS current source to connect an NMOS transistor (not shown) with its drain source path in series between the drain of the PMOS current source transistor and the respective node ND1, ND2 driven by the respective current source, and to connect the gate of the NMOS transistor to the upper supply potential VCC. In this way, reverse currents through the respective PMOS current source transistor from the transmission line into the upper power supply line can be avoided even if the potential on the transmission line exceeds VCC, e.g. if the power supply of the respective line terminal circuit is switched off.

In the above embodiments, MOS transistors are used. Of course, these transistors may be replaced by bipolar transistors.

Although preferred embodiments of the system and apparatus of the present invention have been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A line terminal circuit, comprising:
   a buffer section for connection to a transmission line and for performing at least one of the functions of receiving signals from said transmission line and transmitting signals via said transmission line;
   a controllable current source section connected to inject or withdraw a current into or from a node between said buffer section and said transmission line in accordance with a current control signal; and
   a common mode voltage control section for detecting a common mode voltage component on the transmission path connected to the buffer section and for generating said current control signal in response to said detected common mode voltage component and outputting said current control signal to said current source section;
   wherein resistances are connected in series with conductors of said transmission line; and
   wherein said common mode voltage control section is adapted to output said current control signal such that said current is injected into or withdrawn from said node to generate a voltage drop across said resistances counteracting an excessive common mode voltage at said node, and to maintain said common mode voltage component within the limits of a predetermined voltage interval.

2. The line terminal circuit of claim 1, wherein said common mode voltage control section is adapted to output said current control signal such that said common mode voltage component approximates a predetermined value.

3. The line terminal circuit of claim 1, wherein said buffer section is adapted for connection to an asymmetric transmission line; and wherein said common mode voltage component detectable by said common mode voltage control section, is a DC voltage component superimposed on the signaling voltage across the conductors of said transmission line.

4. The line terminal circuit of claim 1, wherein said buffer section is adapted for connection to a symmetric transmission line; and wherein said common mode voltage component detectable by said common mode voltage control section, is a DC voltage component relative to a buffer section reference potential and present on both conductors of said transmission line.

5. The line terminal circuit of claim 4, wherein said controllable current source section comprises:
   a first current generator circuit, connected to inject current into or withdraw current from a first node connected to a first conductor of said transmission line; and
   a second current generator circuit, connected to inject current into or withdraw current from a second node connected to a second conductor of said symmetric transmission line.

6. The line terminal circuit of claim 5, wherein each of said first and said second current generator circuits comprises:
   an upper current generator circuit comprising a first transistor of a first conductivity type and connected between an upper power supply potential and said associated node; and
   a lower current generator circuit comprising a second transistor of a second conductivity type and connected between a lower power supply potential and said associated node, the gates of said first transistor and of said second transistor, respectively, being connected to receive a first and a second control signal, respectively, from said common mode voltage control section.

7. A line terminal circuit of claim 6, wherein said first and second current generator circuits are connected to receive a same current control signal and are adapted to provide said first node and said second node with substantially equal currents.

8. A line terminal circuit of claim 1, wherein said common mode voltage control section comprises:
   a pair of transistors having their drain source paths connected in parallel, the gates of said pair of transistors being connected to detect a common mode voltage level at said buffer section; and
   a current sink transistor having its gate connected to its drain, the drain source path of the current sink transistor being connected in series with the drain source paths of said pair of transistors, the gate of said current sink transistor being connected to provide said control signal.

9. The line terminal circuit of claim 8, further comprising a voltage source connected in series with and between said current sink transistor and said pair of transistors.

10. The line terminal circuit of claim 9, wherein said voltage source comprises a diode or a series connection of a plurality of diodes.

11. The line terminal circuit of claim 7, wherein said common mode voltage control section comprises:
   a first operational amplifier connected to receive at one of its differential inputs a first reference voltage potential and to receive at its other input a common mode voltage detection signal, the output of said first operational amplifier being connected to provide said first control signal to said first and said second upper current generator circuits; and
   a second operational amplifier connected to receive at one of its differential inputs a second reference voltage potential and to receive at its other input said common mode voltage detection signal, the output of said second operational amplifier being connected to provide said second control signal to said first and said second lower current generator circuits.

12. The line terminal circuit of claim 11, further comprising:
   a series connection of a first common mode voltage detection resistance and a second common mode voltage detection resistance, said series connection of common mode voltage detection resistances being connected across said first and said second nodes; and
   a third node between said first and said second common mode detection resistances being connected to provide said common mode voltage detection signal to said operational amplifiers.

13. The line terminal circuit of claim 1, further comprising:
   a first resistance connected in series between said buffer section and a first transmission line terminal; and
   a second resistance connected in series between said buffer section and a second transmission line terminal.

14. The line terminal circuit of claim 1, wherein said buffer section is an input buffer section having input terminals for receiving digital signals from said transmission line and an output terminal for outputting the received digital data to a digital signal processing section.

15. The line terminal circuit of claim 1, wherein said buffer section is an output buffer section having an input terminal for receiving digital data from a digital signal generating section and output terminals for outputting the digital signals to said transmission line.

16. The line terminal circuit of claim 1, wherein said line terminal circuit is interpreted on a semiconductor substrate.

17. A system for transmitting digital data via a transmission line, said system comprising:
- a first line terminating circuit located at a transmitting side, said first line terminating circuit comprising:
  - an output buffer section having an input terminal for receiving digital data from a digital signal generating section and output terminals for outputting the digital signals to said transmission line;
  - a controllable current source section connected to inject or withdraw a current into or from a node between said output buffer section and said transmission line in accordance with a current control signal; and
  - a common mode voltage control section for detecting a common mode voltage component on the transmission path connected to the output buffer section and for generating said current control signal in response to said detected common mode voltage component and outputting said current control signal to said current source section;
  - wherein resistances are connected in series with conductors of said transmission line; and
  - wherein said common mode voltage control section is adapted to output said current control signal such that said current is injected into or withdrawn from said node to generate a voltage drop across said resistances counteracting an excessive common mode voltage at said node, and to maintain said common mode voltage component within the limits of a predetermined voltage interval; and
- a second line terminating circuit located at a receiving side, said transmission line being connected between said first line terminating circuit and said second line terminating circuit.

18. A system for transmitting digital data via a transmission line, said system comprising:
- a first line terminating circuit located at a receiving side, said first line terminating circuit comprising:
  - an input buffer section having input terminals for receiving digital signals from said transmission line and an output terminal for outputting the received digital data to a digital signal processing section;
  - a controllable current source section connected to inject or withdraw a current into or from a node between said input buffer section and said transmission line in accordance with a current control signal; and
  - a common mode voltage control section for detecting a common mode voltage component on the transmission path connected to the input buffer section and for generating said current control signal in response to said detected common mode voltage component and outputting said current control signal to said current source section;
  - wherein resistances are connected in series with conductors of said transmission line; and
  - wherein said common mode voltage control section is adapted to output said current control signal such that said current is injected into or withdrawn from said node to generate a voltage drop across said resistances counteracting an excessive common mode voltage at said node, and to maintain said common mode voltage component within the limits of a predetermined voltage interval; and
- a second line terminating circuit located at a transmitting side, said transmission line connected between said first line terminating circuit and said second line terminating circuit.

19. A system for transmitting digital data via a transmission line, said system comprising
- a first line terminating circuit comprising:
  - an output buffer section having an input terminal for receiving digital data from a digital signal generating section and output terminals for outputting the digital signals to said transmission line;
  - a controllable current source section connected to inject or withdraw a current into or from a node between said output buffer section and said transmission line in accordance with a current control signal; and
  - a common mode voltage control section for detecting a common mode voltage component on the transmission path connected to the output buffer section and for generating said current control signal in response to said detected common mode voltage component and outputting said current control signal to said current source section;
  - wherein resistances are connected in series with conductors of said transmission line; and
  - wherein said common mode voltage control section is adapted to output said current control signal such that said current is injected into or withdrawn from said node to generate a voltage drop across said resistances counteracting an excessive common mode voltage at said node, and to maintain said common mode voltage component within the limits of a predetermined voltage interval; and
- a second line terminating circuit comprising:
  - an input buffer section having input terminals for receiving digital signals from said transmission line and an output terminal for outputting the received digital data to a digital signal processing section;
  - a controllable current source section connected to inject or withdraw a current into or from a node between said input buffer section and said transmission line in accordance with a current control signal; and
  - a common mode voltage control section for detecting a common mode voltage component on the transmission path connected to the input buffer section and for generating said current control signal in response to said detected common mode voltage component and outputting said current control signal to said current source section;
  - wherein resistances are connected in series with conductors of said transmission line; and
  - wherein said common mode voltage control section is adapted to output said current control signal such that said current is injected into or withdrawn from said node to generate a voltage drop across said resistances counteracting an excessive common mode voltage at said node, and to maintain said common mode voltage component within the limits of a predetermined voltage interval.

* * * * *